(12) United States Patent
Kaneko et al.

(10) Patent No.: US 9,210,808 B2
(45) Date of Patent: Dec. 8, 2015

(54) WIRING SUBSTRATE AND METHOD OF MANUFACTURING THE SAME

(75) Inventors: Kentaro Kaneko, Nagano (JP); Toshimitsu Omiya, Nagano (JP); Kotaro Kodani, Nagano (JP); Junichi Nakamura, Nagano (JP); Kazuhiro Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 70 days.

(21) Appl. No.: 13/616,348

(22) Filed: Sep. 14, 2012

(65) Prior Publication Data

US 2013/0075145 A1 Mar. 28, 2013

(30) Foreign Application Priority Data

Sep. 27, 2011 (JP) ................. 2011-210212

(51) Int. Cl.
*H05K 1/11* (2006.01)
*H05K 3/46* (2006.01)
(Continued)

(52) U.S. Cl.
CPC ............ *H05K 1/113* (2013.01); *H01L 21/4857* (2013.01); *H01L 21/6835* (2013.01); *H01L 23/13* (2013.01); *H01L 23/49822* (2013.01); *H01L 23/544* (2013.01); *H01L 24/16* (2013.01); *H01L 24/81* (2013.01); *H05K 3/4682* (2013.01); *H01L 2221/68345* (2013.01); *H01L 2221/68381* (2013.01); *H01L 2223/54426* (2013.01); *H01L 2223/54486* (2013.01); *H01L 2224/131* (2013.01); *H01L 2224/16225* (2013.01); *H01L 2224/32225* (2013.01); *H01L 2224/73204* (2013.01); *H01L 2224/81193* (2013.01); *H01L 2224/81815* (2013.01); *H01L 2224/92125* (2013.01); *H01L 2924/15311* (2013.01);
(Continued)

(58) Field of Classification Search
USPC .......................................... 439/76.1; 174/255
See application file for complete search history.

(56) References Cited

U.S. PATENT DOCUMENTS 5,136,456 A * 8/1992 Yeh .................................. 361/63
5,329,695 A * 7/1994 Traskos et al. .................. 29/830
(Continued)

FOREIGN PATENT DOCUMENTS

JP 11-054896 2/1999
JP 2003229512 A * 8/2003
(Continued)

OTHER PUBLICATIONS

Japan Office Action mailed Apr. 14, 2015, with English translation.
(Continued)

*Primary Examiner* — Timothy Thompson
*Assistant Examiner* — Krystal Robinson
(74) *Attorney, Agent, or Firm* — Kratz, Quintos & Hanson, LLP

(57) ABSTRACT

A wiring substrate includes an insulating layer, a connection pad buried in the insulating layer in a state that an upper surface of the connection pad is exposed from an upper surface of the insulating layer and a lower surface and at least a part of a side surface of the connection pad contact the insulating layer, and a concave level difference portion formed in the insulating layer around an outer periphery part of the connection pad, wherein an upper surface of the connection pad and an upper surface of the insulating layer are arranged at a same height.

18 Claims, 12 Drawing Sheets

(51) Int. Cl.
  *H01L 23/00*  (2006.01)
  *H01L 23/544*  (2006.01)
  *H01L 21/683*  (2006.01)
  *H01L 23/13*  (2006.01)
  *H01L 23/498*  (2006.01)
  *H01L 21/48*  (2006.01)

(52) U.S. Cl.
  CPC ............. *H05K2201/0376* (2013.01); *H05K 2201/09036* (2013.01); *H05K 2203/0376* (2013.01); *Y10T 29/49155* (2015.01)

(56) References Cited

U.S. PATENT DOCUMENTS

| | | | |
|---|---|---|---|
| 6,228,466 B1 | 5/2001 | Tsukada et al. | |
| 6,306,751 B1 * | 10/2001 | Patel et al. | 438/614 |
| 6,723,927 B1 * | 4/2004 | Fan et al. | 174/262 |
| 7,303,978 B2 * | 12/2007 | Ito | 438/464 |
| 7,365,414 B2 * | 4/2008 | Koning et al. | 257/642 |
| 8,127,979 B1 * | 3/2012 | Wu et al. | 228/180.22 |
| 2007/0080439 A1 | 4/2007 | Kikuchi et al. | |
| 2008/0298038 A1 * | 12/2008 | Kaneko | 361/808 |
| 2009/0315190 A1 | 12/2009 | Kikuchi | |
| 2010/0127405 A1 | 5/2010 | Kikuchi et al. | |
| 2010/0323474 A1 * | 12/2010 | Miyazaki | 438/106 |
| 2011/0136298 A1 | 6/2011 | Kikuchi | |
| 2013/0097856 A1 | 4/2013 | Kaneko | |

FOREIGN PATENT DOCUMENTS

| | | |
|---|---|---|
| JP | 2007-109802 A | 4/2007 |
| JP | 2008-300507 | 12/2008 |
| JP | 2011-003705 A | 1/2011 |
| WO | WO 2008/001915 A1 | 1/2008 |

OTHER PUBLICATIONS

Notification information provided by presentation of publications and the like dated Sep. 16, 2014, in the corresponding Japanese patent application No. 2011-210212.

* cited by examiner (fragmental plan view)

FIG. 15
FIG. 16
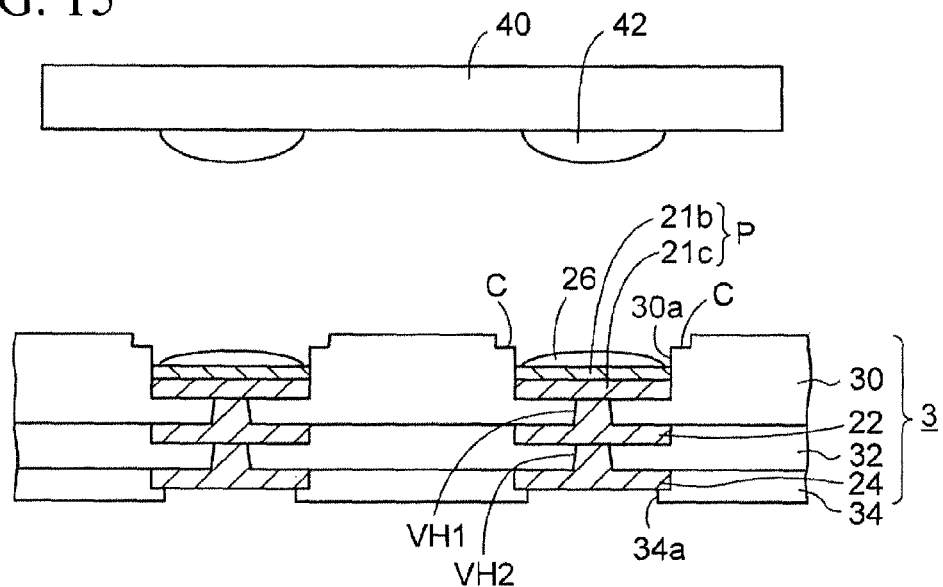
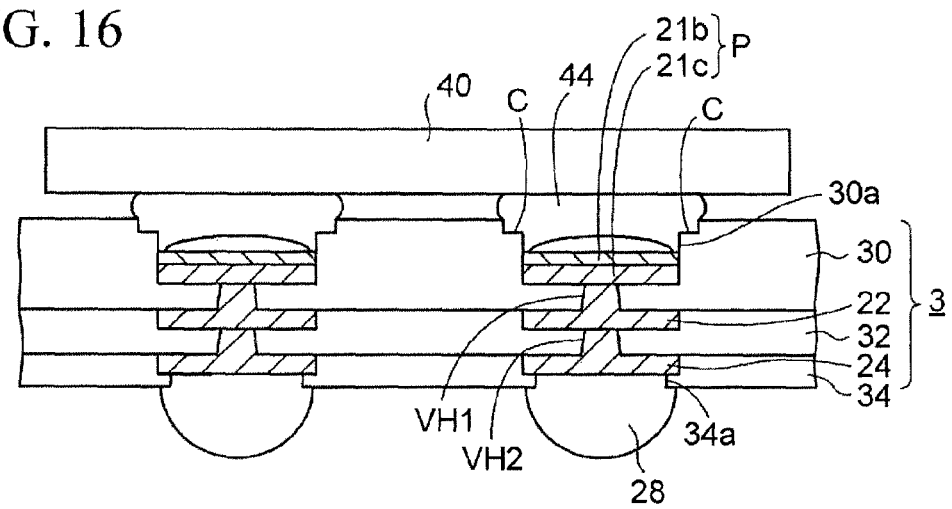

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2011-210212, filed on Sep. 27, 2011, the entire contents of which are incorporated herein by reference.

FIELD

It is related to a wiring substrate on which a semiconductor chip, or the like is mounted, and a method of manufacturing the same.

BACKGROUND

In the prior art, there is a method in which a wiring substrate is obtained by forming a multilayer wiring including connection pads on a supporting plate, and removing the supporting plate to expose the connection pads. Such wiring substrate is manufactured in many cases in a state that surfaces of the connection pads and a surface of an insulating layer constitute the same plane.

As a result, there is such a risk that, in the situation that a pitch of the connection pads of the wiring substrate is made narrower, when a semiconductor chip is flip-chip connected to the connection pads by the solder, the solder flows from the connection pad to the lateral direction to cause an electric short-circuit between the connection pads.

Also, the surface of the wiring substrate on the connection pad side is made flat. Therefore, the accuracy of image recognition of fiducial marks provided on the surface of the wiring substrate on the connection pad side is bad. As a result, it becomes difficult to align and mount the semiconductor chip, or the like with high precision.

A related art is disclosed in International Publication Pamphlet No. WO 2008-001915.

SUMMARY

According to one aspect discussed herein, there is provided a wiring substrate, which includes an insulating layer, a connection pad buried in the insulating layer in a state that an upper surface of the connection pad is exposed from an upper surface of the insulating layer and a lower surface and at least a part of a side surface of the connection pad contact the insulating layer, and a concave level difference portion formed in the insulating layer around an outer periphery part of the connection pad.

Also, according to another aspect discussed herein, there is provided a method of manufacturing a wiring substrate, which includes forming a resist in which an opening portion is provided, on a supporting plate, forming a concave portion in the supporting plate through the opening portion of the resist, forming a metal layer for a connection pad in the concave portion of the supporting plate and the opening portion of the resist, by an electroplating utilizing the supporting plate as a plating power feeding path, removing the resist, forming a ring-like part of the supporting plate around an outer periphery part of the metal layer as a convex level difference portion whose height is higher than other etched surfaces, by etching the supporting plate, forming an insulating layer covering the metal layer, on the supporting plate, and exposing the metal layer by removing the supporting plate.

Also, according to still another aspect discussed herein, there is provided a method of manufacturing a wiring substrate, which includes forming a resist in which an opening portion is provided, on a supporting plate, forming a laminated metal layer by forming a sacrifice metal layer and a metal layer for a connection pad sequentially on the supporting plate in the opening portion of the resist, by an electroplating utilizing the supporting plate as a plating power feeding path, removing the resist, forming a ring-like part of the supporting plate around an outer periphery part of the laminated metal layer as a convex level difference portion whose height is higher than other etched surfaces, by etching the supporting plate, forming an insulating layer covering the laminated metal layer, on the supporting plate, and exposing the metal layer for the connection pad, by removing the supporting plate and the sacrifice metal layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 15 is a sectional view (#1) depicting a state that the semiconductor chip is flip-chip connected to the wiring substrate in FIG. 13; and FIG. 16 is a sectional view (#2) depicting a state that the semiconductor chip is flip-chip connected to the wiring substrate in FIG. 13.

DESCRIPTION OF EMBODIMENTS

Embodiments will be explained with reference to the accompanying drawings hereinafter.

(First Embodiment)

Figure 1A:
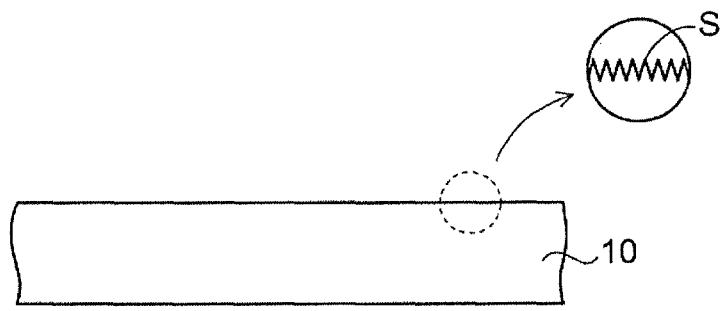
FIGS. 1A to 1E are sectional views (#1) depicting a method of manufacturing a wiring substrate according to a first embodiment.
Figure 1B:
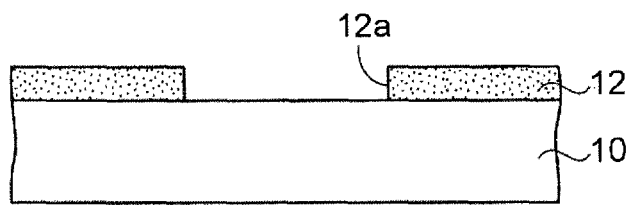
Figure 1C:
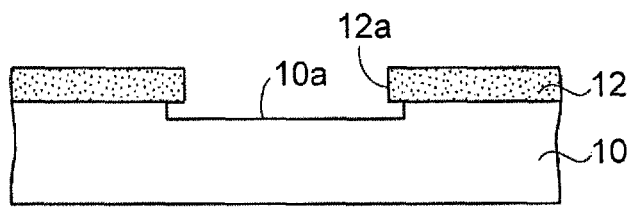
Figure 1D:
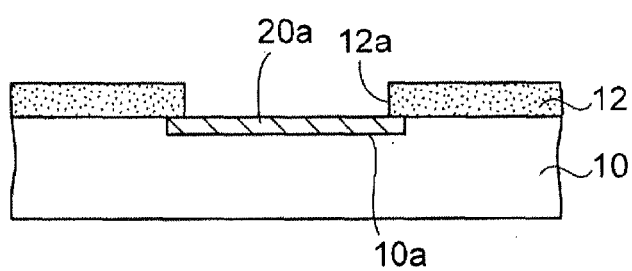
Figure 1E:
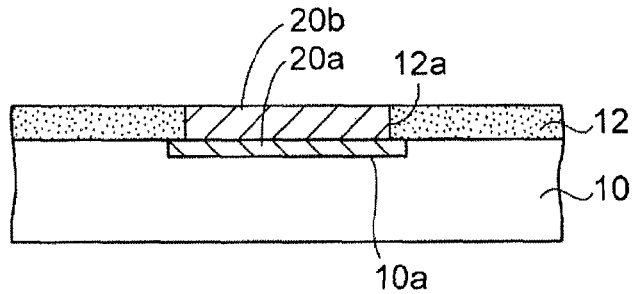
Figure 2A:
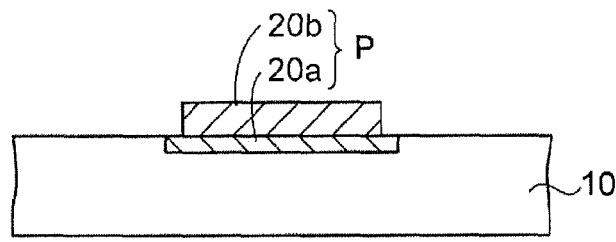
FIGS. 2A to 2D are sectional views (#2) depicting the method of manufacturing the wiring substrate according to the first embodiment.
Figure 2B:
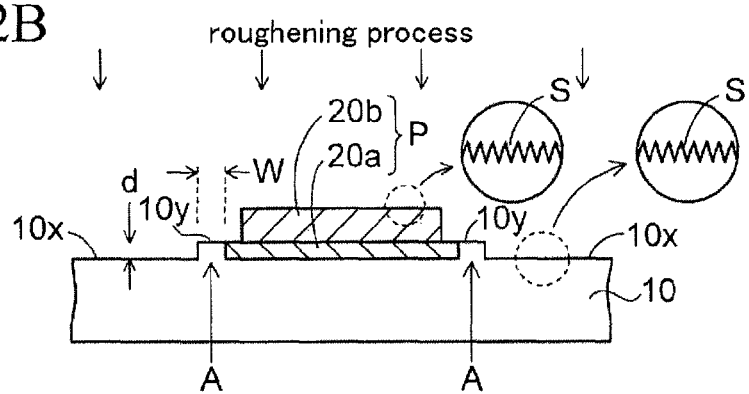
Figure 2C:
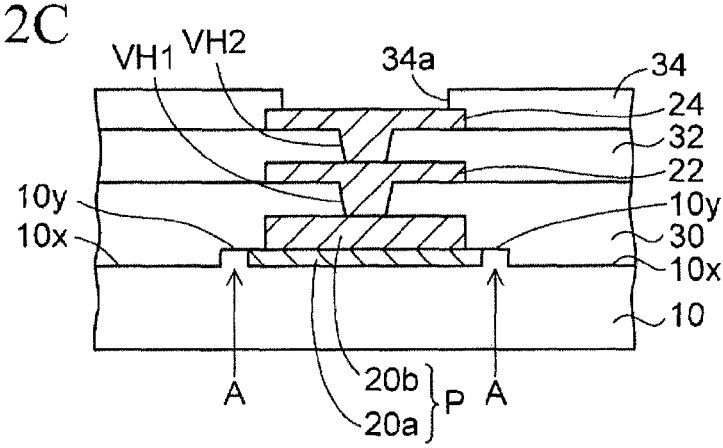
Figure 2D:
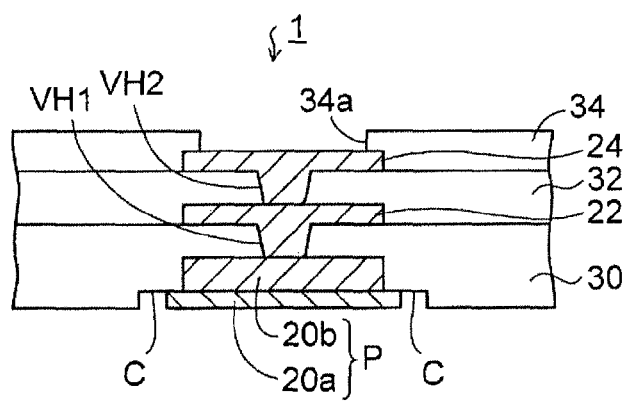
Figure 3:
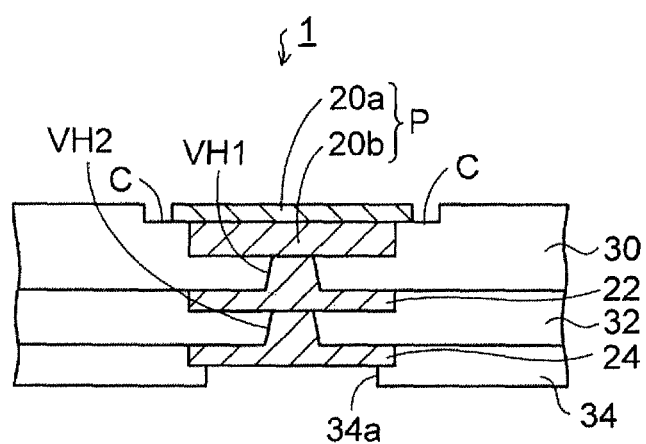
FIG. 3 is a sectional view and a fragmental plan view depicting a wiring substrate according to the first embodiment.
Figure 3:
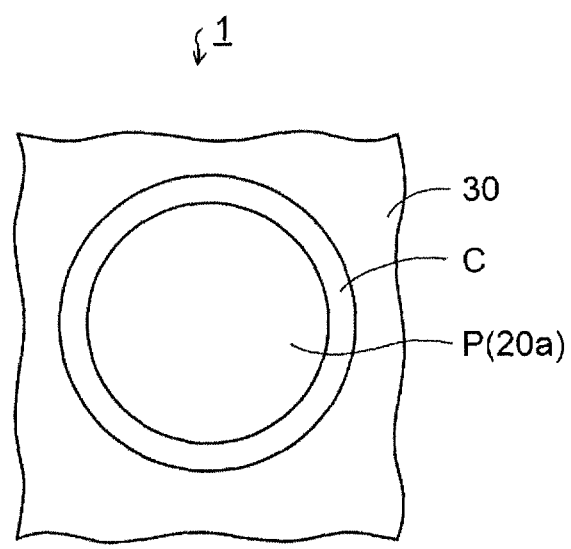

FIG. 1A to FIG. 2D are sectional views depicting a method of manufacturing a wiring substrate according to a first embodiment, and FIG. 3 are views depicting a wiring substrate according to the first embodiment.

In the method of manufacturing the wiring substrate according to the first embodiment, as depicted in FIG. 1A, first, a supporting plate 10 made of copper (Cu) is prepared as a temporary substrate. As the supporting plate 10, a metal plate or a metallic foil is used, and a copper foil is used as an example. Then, the surface of the supporting plate 10 is made uneven by the roughening process, and thus a roughened surface S is obtained.

Then, as depicted in FIG. 1B, a dry film resist 12 is pasted onto the roughened surface S of the supporting plate 10, and then an opening portion 12a is formed in the dry film resist 12 by using the photolithography. The opening portion 12a is formed in the dry film resist 12 like a circular shape when viewed from the top.

At this time, the dry film resist 12 is formed on the roughened surface S of the supporting plate 10. Therefore, this dry film resist 12 can be formed with good adhesion to the supporting plate 10.

Here, a liquid resist may be used instead of the dry film resist 12.

Then, as depicted in FIG. 1C, a concave portion 10a is formed by performing the wet etching to the supporting plate 10 through the opening portion 12a of the dry film resist 12. Since the concave portion 10a of the supporting plate 10 is formed by the isotropic etching, the concave portion 10a is formed with a size that is larger than the opening portion 12a of the dry film resist 12. A depth of the concave portion 10a is set in the range from 1 μm to 5 μm, for example.

Then, as depicted in FIG. 1D, a nickel (Ni) layer 20a (barrier metal layer) is formed on the concave portion 10a of the supporting plate 10 in the opening portion 12a of the dry film resist 12 by the electroplating utilizing the supporting plate 10 as a plating power feeding path.

In the example in FIG. 1D, the nickel layer 20a is filled in the whole of the concave portion 10a of the supporting plate 10. In this case, this nickel layer 20a may be formed until the halfway position of the depth of the concave portion 10a, or may be formed until the halfway position of the depth of the opening portion 12a of the dry film resist 12.

In the step of forming the nickel layer 20a, the bottom surface of the concave portion 10a of the supporting plate 10 is formed as a smooth surface by the etching process. Therefore, even when the nickel layer 20a is formed with thin film, the nickel layer 20a can be formed to cover satisfactorily the bottom surface of the concave portion 10a.

Then, as depicted in FIG. 1E, a copper layer 20b is formed on the nickel layer 20a in the opening portion 12a of the dry film resist 12 by the similar electroplating.

In this manner, metal layers for the connection pad are formed in the concave portion 10a of the supporting plate 10 and the opening portion 12a of the dry film resist 12.

Subsequently, as depicted in FIG. 2A, the dry film resist 12 is removed. In the first embodiment, a connection pad P is formed of the nickel layer 20a (barrier metal layer) and the copper layer 20b. The connection pad P is formed as a first wiring layer. The connection pad P may be formed to be isolated like an island shape, or may be arranged such that this connection pad P is connected to one end of the leading wiring layer which is extended.

Then, as depicted in FIG. 2B, a roughening process liquid is sprayed onto a structural body in FIG. 2A from a nozzle (not shown) of the spray equipment. Therefore, the surface of the copper layer 20b of the connection pad P is etched, and thus the roughened surface S is formed.

At this time, the surface of the supporting plate 10 (copper) is also etched, and the roughened surface S is still maintained. As the roughening process liquid, a liquid that the additive agent formed of a compound such as imidazole, triazole, amine, or the like, which forms a complex together with copper, is contained in a formic acid or an acetic acid, is used.

In the wet etching executed by using this roughening process liquid, there is such a tendency that the roughening process liquid is not sufficiently supplied to an outer periphery part A (foot part) of the convex connection pad P having the convex shape. Consequently, in the ring-like part of the supporting plate 10 (copper) as the outer periphery part A of the connection pad P, an amount of etching executed by the roughening process liquid is considerably smaller than other areas.

As a result, the ring-like part of the supporting plate 10 (copper) as the outer periphery part A of the connection pad P constitutes a convex level difference portion 10y whose height is higher than other etched surface 10x. A width W of the convex level difference portion 10y formed around the connection pad P is set in the range from 2 μm to 5 μm, for example. Also, an amount of etching (depth) d of the supporting plate 10 (copper) executed by the roughening process liquid is set in the range from 1 μm to 5 μm, for example.

In the first embodiment, the supporting plate 10 is etched such that the etched surface 10x of the supporting plate 10 is positioned at the same height as a lower surface of the nickel layer 20a.

Here, in addition to the method using the spray equipment, the similar etching results to the above can be obtained by the method in which a work is dipped in a treatment tab, and is wet-etched, or the like.

Then, as depicted in FIG. 2C, a first interlayer insulating layer 30 is formed on the supporting plate 10 and the connection pad P. Then, the first interlayer insulating layer 30 is processed by the laser, thereby a first via hole VH1 reaching the connection pad P is formed. The first interlayer insulating layer 30 is formed by pasting a resin sheet made of an epoxy resin, a polyimide resin, or the like.

Since the surfaces of the connection pad P and the supporting plate 10 are formed as the roughened surface S, the first interlayer insulating layer 30 is formed on them with good adhesion.

Otherwise, a photosensitive resin may be used as the first interlayer insulating layer 30, and then the first via hole VH1 may be formed by the photolithography. Also, in addition to the pasting of the resin sheet, a liquid resin may be coated.

Then, a second wiring layer 22 connected to the connection pad P via the first via hole VH1 (via conductor) is formed on the first interlayer insulating layer 30. The second wiring layer 22 is formed by the semi-additive process, for example.

To explain in detail, first, a seed layer (not shown) made of copper, or the like is formed on the first interlayer insulating layer 30 and an inner surface of the first via hole VH1 by the electroless plating or the sputter method. Then, a plating resist (not shown) in which an opening portion is provided on the part where the second wiring layer 22 is arranged, is formed on the seed layer.

Then, a metal plating layer made of copper, or the like is formed from an inner part of the first via hole VH1 to the opening portion of the plating resist by the electroplating utilizing the seed layer as a plating power feeding path. Then, the plating resist is removed, and then the seed layer is etched while using the metal plating layer as a mask. By this matter, the second wiring layer 22 is formed of the seed layer and the metal plating layer.

Then, by repeating the similar steps, a second interlayer insulating layer 32, in which a second via hole VH2 reaching the second wiring layer 22 is provided, is formed on the first interlayer insulating layer 30. Subsequently, by repeating the similar steps, a third wiring layer 24, which is connected to the second wiring layer 22 via the second via hole VH2 (via conductor), is formed on the second interlayer insulating layer 32.

Then, a protection insulating layer 34, in which an opening portion 34a is provided on the connection part of the third wiring layer 24, is formed. As the protection insulating layer 34, a solder resist, or the like is used. Then, as the need arises, a contact layer is formed on the connection part of the third wiring layer 24 by forming nickel/gold plating layers in sequence from the bottom, or the like.

Then, as depicted in FIG. 2D, the supporting plate 10 (copper) is removed by the wet etching using an etchant such as an alkaline aqueous solution, or the like. At this time, the nickel layer 20a (barrier metal layer) of the connection pad P and the first interlayer insulating layer 30 (resin) function as an etching stop layer when the supporting plate 10 (copper) is etched, and thus the etching is stopped.

In the case that the copper is exposed from the surface of the third wiring layer 24, the supporting plate 10 (copper) is etched in a state that the third wiring layer 24 is protected with a protection sheet.

At this time, the convex level difference portion 10y of the supporting plate 10, which is obtained in the above step in FIG. 2B, is also etched and thus removed. Therefore, a concave level difference portion C is formed in the first interlayer insulating layer 32 located in the outer periphery part of the nickel layer 20a of the connection pad P 30 in a state that the concave level difference portion C is connected like ring shape. With the above, a wiring substrate 1 of the first embodiment is obtained.

In this case, when the large-size supporting plate 10 available for the multi production is employed, a wiring member in FIG. 2D is cut such that individual wiring substrates can be obtained.

In the present embodiment, the supporting plate 10 is formed of copper, and also the nickel layer 20a is formed as the barrier metal layer in the undermost position of the connection pad P. Therefore, the supporting plate 10 (copper) can be removed selectively with respect to the connection pad P.

Except the combination of copper and nickel, the barrier metal layer of the connection pad P may be formed of various metals, which are different from the supporting plate 10, so as to have the resistance when the supporting plate 10 is wet-etched.

For example, in the case that the supporting plate 10 is formed of the copper, in addition to nickel (Ni) as the barrier metal layer of the connection pad P, gold (Au), palladium (Pd), silver (Ag), or the like can be used.

In FIG. 3, the state that the wiring substrate 1 in FIG. 2D is reversed up and down is depicted. As depicted in FIG. 3, in the wiring substrate 1 of the first embodiment, the connection pad P is buried in the first interlayer insulating layer 30 as the first wiring layer in a state that the upper surface of the connection pad P is exposed from the first interlayer insulating layer 30.

In the example of the first embodiment, the connection pad P is formed of the copper layer 20b and the nickel layer 20a (barrier metal layer) formed on the copper layer 20b. A diameter of the nickel layer 20a is set larger than a diameter of the copper layer 20b, and such a situation is obtained that the nickel layer 20a protrudes outward from the outer peripheral edge of the copper layer 20b.

In this manner, the connection pad P includes a lower layer part and an upper layer part whose diameter is larger than that of the lower layer part. An example of the lower layer part of the connection pad P corresponds to the copper layer 20b, and an example of the upper layer part corresponds to the nickel layer 20a. An outer peripheral edge of the lower layer part (copper layer 20b) of the connection pad P retrogresses toward a center of the connection pad P from an outer peripheral edge of the upper layer part (nickel layer 20a).

As an example of a planar shape of the connection pad P, the connection pad P is formed like a circular shape. In this case, a diameter of the connection pad P is set in the range from 20 μm to 150 μm. In this mode, a retrogressing width that the outer peripheral edge of the lower layer part (copper layer 20b) of the connection pad P retrogresses toward the center of the connection pad P from the outer peripheral edge of the upper layer part (nickel layer 20a), is about from 0.5 μm to 5 μm.

Here, as a planar shape of the connection pad P, any planar shape such as a rectangular shape, a polygonal shape, or the like other than the circular shape may be used.

As described above, in the present embodiment, the method in which the connection pad P is exposed by removing the supporting plate 10 after the multilayer wiring including the connection pads P is formed on the supporting plate 10, is employed. As a result, both the upper surface of the connection pad P and the upper surface of the first interlayer insulating layer 30 in the wiring substrate 1 are arranged at the same height.

The nickel layer 20a is illustrated as the barrier metal layer of the connection pad P. In this case, the barrier metal layer may be formed of either a single metal layer selected from a group consisting of gold (Au), palladium (Pd), nickel (Ni), copper (Cu), and silver (Ag) or a laminated metal film including two metals or more.

Preferably, a laminated film formed of gold layer/nickel layer from the top, a laminated film formed of gold layer/palladium layer/nickel layer from the top, a laminated film formed of gold layer/silver layer/palladium layer/nickel layer from the top, a single layer film formed of a silver layer, a laminated film formed of silver layer/nickel layer from the top, a laminated film formed of silver layer/palladium layer/nickel layer from the top, or the like can be used in the state in FIG. 3. Namely, the gold layer or the silver layer is formed as a layer exposed to the outside.

In the above step in FIG. 1D, any plating metal layer may be formed so as to obtain a desired barrier metal layer in place of the nickel layer 20a.

In the example in FIG. 3, the lower surface of the connection pad P and the whole side surface of the lower layer part (copper layer 20b) contact the first interlayer insulating layer 30 and are buried in it, and the side surface of the upper layer part (nickel layer 20a) is exposed. In this case, at least a part of the side surface of the connection pad P may contact the first interlayer insulating layer 30 and is buried in it.

By reference to a fragmental plan view in FIG. 3 together, the concave level difference portion C is formed in the ring-like part on the first interlayer insulating layer 30 as the outer periphery part of the nickel layer 20a of the connection pad P. The concave level difference portion C is provided to contact the outer peripheral edge of the upper layer part (nickel layer 20a) of the connection pad P. Also, the concave level difference portion C is formed from the upper surface of the first interlayer insulating layer 30 to the position corresponding to the lower surface of the nickel layer 20a (upper layer part).

In this manner, in the wiring substrate 1 of the first embodiment, the lower surface and the side surface of the copper layer 20b of the connection pad P are buried in the first interlayer insulating layer 30, and the concave level difference portion C is formed in the first interlayer insulating layer 30 around the outer periphery part of the nickel layer 20a of the connection pad P. By this matter, the upper surface and the side surface of the nickel layer 20a of the connection pad P are exposed from the first interlayer insulating layer 30.

Further, in the first interlayer insulating layer 30, the first via hole VH1 reaching the connection pad P from its lower surface side is provided. Then, the second wiring layer 22 connected to the connection pad P via the first via hole VH1 (via conductor) is formed on the lower surface of the first interlayer insulating layer 30.

Similarly, the second interlayer insulating layer 32, in which the second via hole VH2 reaching the second wiring layer 22 is provided, is also formed on the lower surface of the first interlayer insulating layer 30. Similarly, the third wiring layer 24 connected to the second wiring layer 22 via the second via hole VH2 (via conductor) is also formed on the lower surface of the second interlayer insulating layer 32. Also, the protection insulating layer 34, in which the opening portion 34a is provided on the connection part of the third wiring layer 24, is formed on the lower surface of the second interlayer insulating layer 32.

In the example in FIG. 3, the two-layer build-up wiring layer connected to the connection pad P is formed on the lower side of the first interlayer insulating layer 30. In this case, the number of layers in the build-up wiring layer can be set arbitrarily to n layers (n is an integer of 1 or more). This is similar in the second and third embodiments.

As depicted in FIG. 3, the via holes VH1, VH2 of the wiring substrate 1 of the first embodiment are formed respectively in such a manner that a sectional shape is formed like a frustum of circular cone, whose bottom surface is arranged to the connection pad side and which is opened toward the formation surface side of the external connection terminals, and in which a diameter on the bottom surface side is set smaller than a diameter on the opening side.

The wiring substrate 1 of the present embodiment can be manufactured as a coreless substrate which does not have a core substrate whose thickness is thick, and can also be used as the mounting substrate available for a high-performance semiconductor chip.

Figure 4:
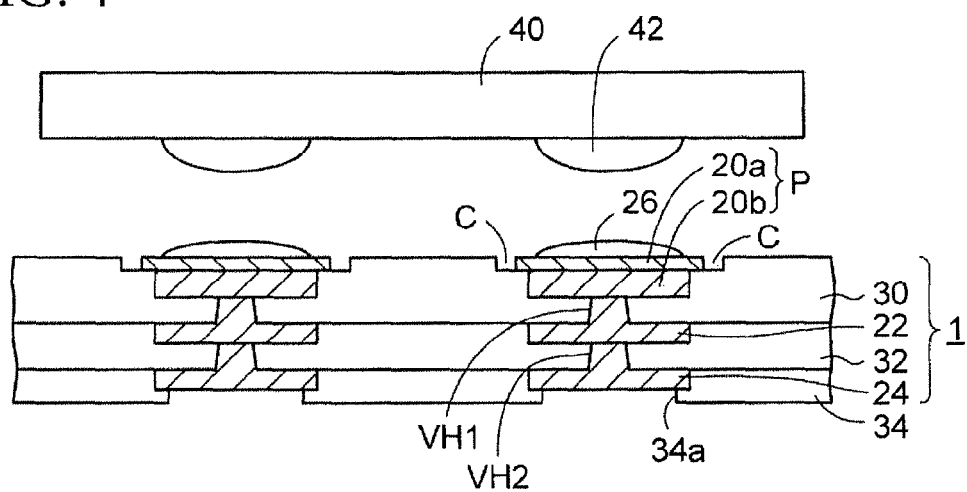
FIG. 4 is a sectional view (#1) depicting a state that the semiconductor chip is flip-chip connected to the wiring substrate in FIG. 3.
Figure 5:
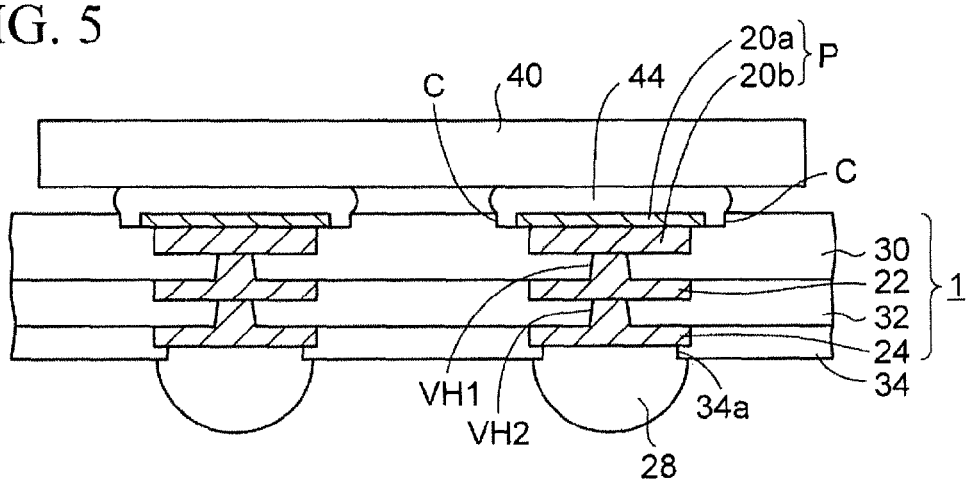
FIG. 5 is a sectional view (#2) depicting a state that the semiconductor chip is flip-chip connected to the wiring substrate in FIG. 3.

In FIG. 4 and FIG. 5, a state that a semiconductor chip is flip-chip connected to the wiring substrate 1 of the present embodiment is depicted.

As depicted in FIG. 4, flux (not shown) is coated on the connection pads P of the wiring substrate 1 in FIG. 3, and then a solder material 26 such as a solder paste, or the like is coated on the connection pads P. Then, a semiconductor chip 40 including solder dumps 42 is prepared, and then the solder dumps 42 of the semiconductor chip 40 are arranged on the solder materials 26 on the connection pads P of the wiring substrate 1.

Then, as depicted in FIG. 5, the semiconductor chip 40 is flip-chip connected to the connection pads P of the wiring substrate 1 by a solder electrode 44 by performing the reflow heating. An underfill resin may be filled in a clearance between the lower side of the semiconductor chip 40 and the upper surface of the wiring substrate 1.

Then, before or after the semiconductor chip is mounted, an external connection terminal 28 is provided by mounting a solder ball on the connection parts of the third wiring layers 24, or the like.

In the wiring substrate 1 of the first embodiment, the concave level difference portion C is formed in the first interlayer insulating layer 30 around the outer periphery part of connection pad P such that it surrounds the connection pad P.

Therefore, when the semiconductor chip 40 is flip-chip connected, the solder is dammed up by the concave level difference portion C formed around the connection pad P, and it can be prevented that the extra solder flows to the adjacent connection pad P to cause an electric short-circuit.

Also, fiducial marks having a structure in which the concave level difference portion C is formed in the first interlayer insulating layer 30 around the connection pads P can be formed simultaneously. The fiducial marks are formed by the similar method to the connection pads P at the time of forming the connection pads P, and become the similar structure to the connection pads P.

At this time, unlike the present embodiment, in the case that the concave level difference portion C is not formed around the connection pad P, particularly when both surface roughness of the connection pads P and the first interlayer insulating layer 30 are equal each other, it is difficult to clearly recognize the images of the fiducial marks.

However, in the present embodiment, irrespective of the surface roughness of the connection pads P and the first interlayer insulating layer 30, the images of the fiducial marks can be clearly recognized by the concave level difference portions C provided around the connection pads P. By this matter, even though the semiconductor chip 40 which includes connection electrodes having a narrow pitch of 100 µm or less is used, such semiconductor chip can be aligned with the wiring substrate 1 with high precision and can be mounted thereon.

Figure 6:
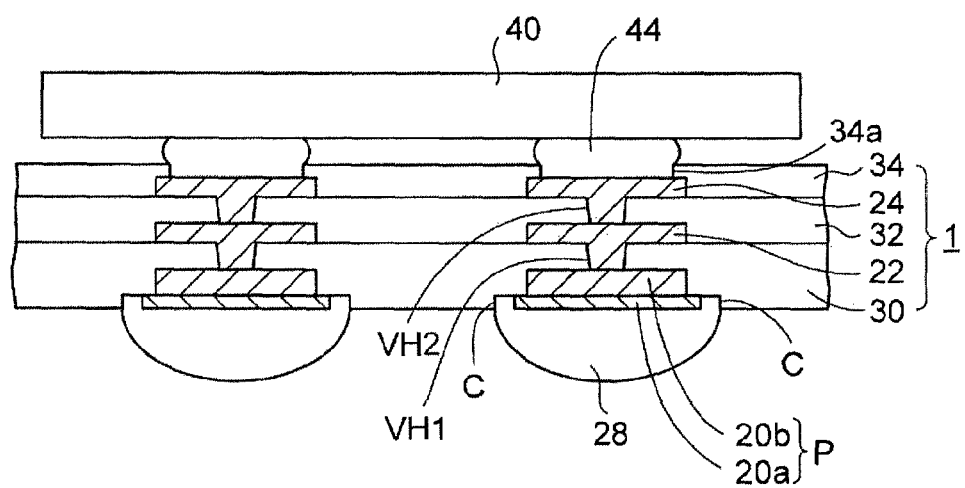
FIG. 6 is a sectional view depicting a state that the semiconductor chip is flip-chip connected to the wiring substrate in FIG. 3, according to another mode.

Otherwise, as depicted in FIG. 6, on the contrary to FIG. 5, the wiring substrate 1 in FIG. 3 may be reversed up and down, and then the semiconductor chip 40 may be flip-chip connected to the connection parts of the third wiring layers 24 via the solder electrodes 44. Then, the external connection terminals 28 are provided by mounting the solder ball on the connection pads P, or the like. In the case of this mode, a diameter of the connection pad P is set in the range from 150 µm to 1000 µm.

Also, a difference of diameter between the upper layer part and the lower layer part of the connection pad P becomes 1 to 10 µm.

(Second Embodiment)

Figure 7A:
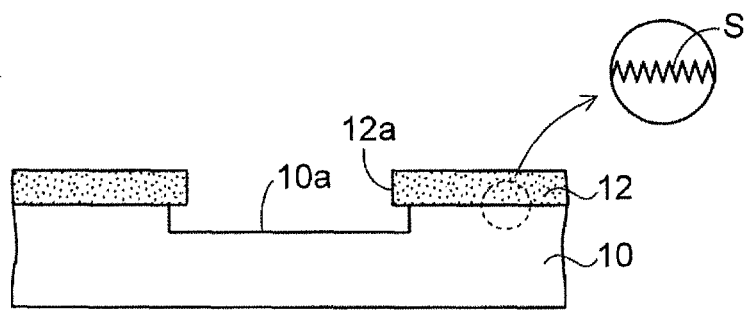
FIGS. 7A to 7D are sectional views (#1) depicting a method of manufacturing a wiring substrate according to a second embodiment.
Figure 7B:
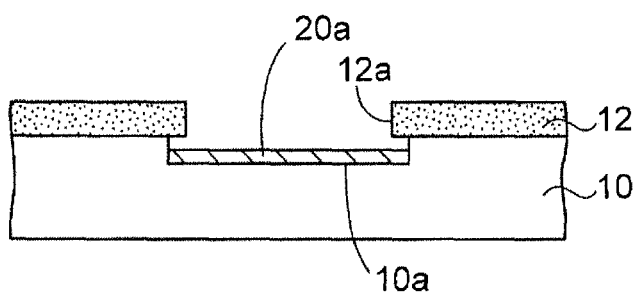
Figure 7C:
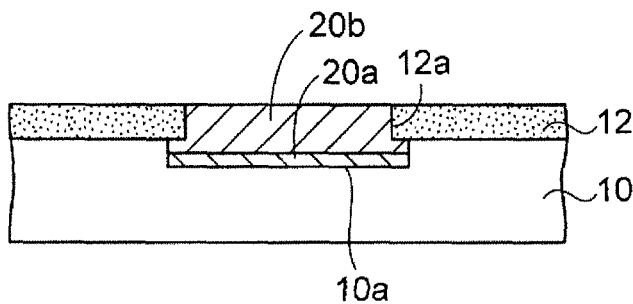
Figure 7D:
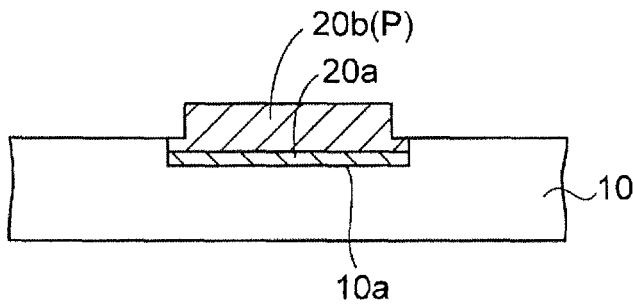
Figure 8A:
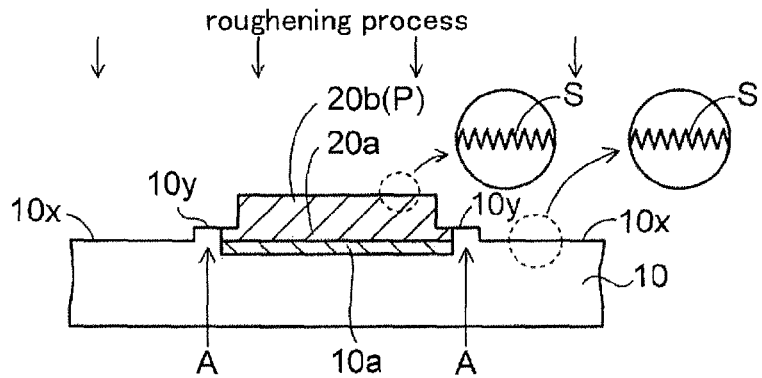
FIGS. 8A to 8D are sectional views (#2) depicting the method of manufacturing the wiring substrate according to the second embodiment.
Figure 8B:
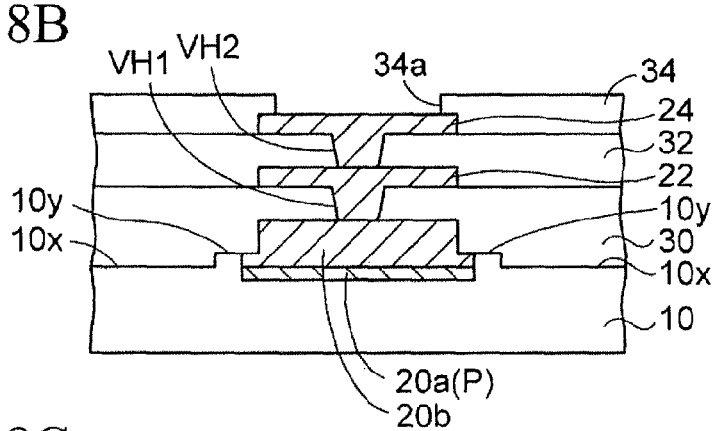
Figure 8C:
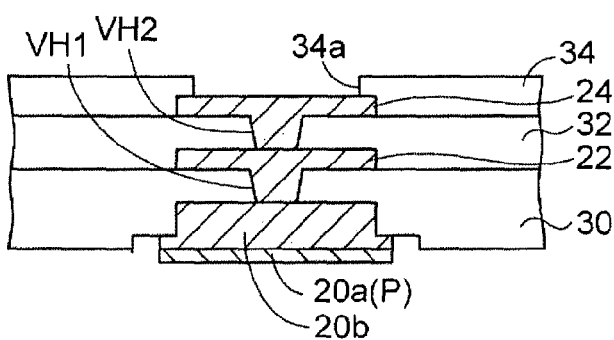
Figure 8D:
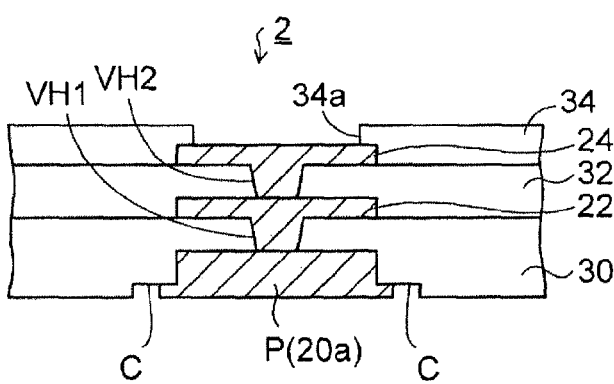
Figure 9:
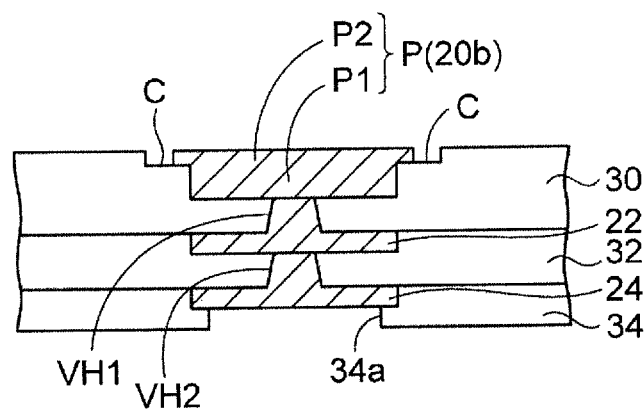
FIG. 9 is a sectional view depicting a wiring substrate according to the second embodiment.
Figure 10:
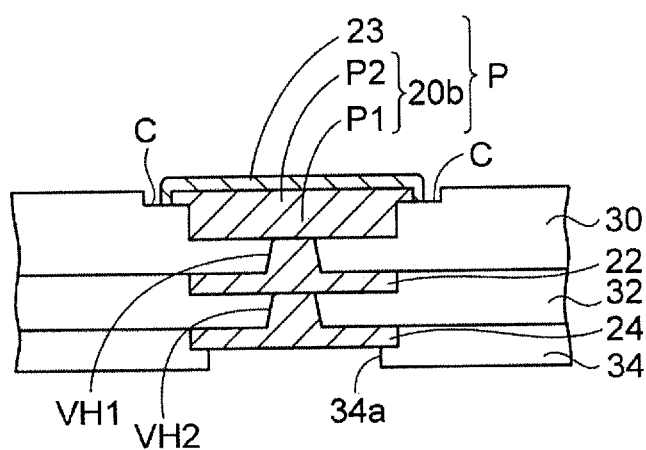
FIG. 10 is a sectional view depicting another wiring substrate according to the second embodiment.

FIGS. 7A to 7D and FIGS. 8A to 8D are sectional views depicting a method of manufacturing a wiring substrate according to a second embodiment, and FIG. 9 and FIG. 10 are sectional views depicting a wiring substrate according to the second embodiment. In the second embodiment, detailed explanation of the same steps and the same elements as those in the first embodiment will be omitted hereunder.

In the above first embodiment, the connection pad P is formed of the copper layer 20b and the barrier metal layer (nickel layer 20a, or the like) formed thereon. In this second embodiment, the connection pad is formed of a single copper layer or the antioxidant (OSP) is formed on a surface of the copper layer.

In the method of manufacturing the wiring substrate according to the second embodiment, as depicted in FIG. 7A, like FIG. 1A to FIG. 3 of the first embodiment, the dry film resist 12 in which the opening portion 12a is provided is patterned on the roughened surface S of the supporting plate 10 made of copper. Then, the concave portion 10a is formed by etching the supporting plate 10 in the opening portion 12a of the dry film resist 12.

Then, as depicted in FIG. 7B, the nickel layer 20a (barrier metal layer) is formed on the concave portion 10a of the supporting plate 10 in the opening portion 12a of the dry film resist 12 by the electroplating utilizing the supporting plate 10 as a plating power feeding path. In the second embodiment, the nickel layer 20a is formed until the halfway position of the depth of the concave portion 10a of the supporting plate 10.

Then, as depicted in FIG. 7C, the copper layer 20b which is connected to the nickel layer 20a is formed from the remaining space of the concave portion 10a of the supporting plate 10 to the opening portion 12a of the dry film resist 12 by the similar electroplating. In this manner, the metal layers for the connection pad are formed in the concave portion 10a of the supporting plate 10 and the opening portion 12a of the dry film resist 12.

Then, as depicted in FIG. 7D, the dry film resist 12 is removed.

In the second embodiment, the copper layer 20b functions as the connection pad P, and the nickel layer 20a (barrier metal layer) formed under the copper layer 20b functions as an etching stop layer when the supporting plate 10 is etched. Then, this nickel layer 20a is removed finally.

Subsequently, as depicted in FIG. 8A, like the first embodiment, the roughening process liquid is sprayed onto a structural body in FIG. 7D by using a spray equipment (not shown). Thereby, the copper layer 20b of the connection pad P and the supporting plate 10 (copper) are etched, and thus the roughened surface S is obtained.

At this time, like the step in FIG. 2B of the first embodiment, the ring-like part of the supporting plate 10 around the outer periphery part A of the connection pad P is formed as the convex level difference portion 10y whose height is higher than the etched surface 10x.

In the second embodiment, the supporting plate 10 is etched such that the etched surface 10x of the supporting plate 10 is set to the same height as the lower surface of the copper layer 20b (connection pad P).

Then, as depicted in FIG. 8B, as in FIG. 2C of the first embodiment, the two-layer build-up wiring layer (the second and third wiring layers 22, 24, the first and second interlayer insulating layers 30, 32, and the protection insulating layer 34) connected to the connection pad P is formed.

Then, as depicted in FIG. 8C, as in FIG. 2D of the first embodiment, the supporting plate 10 is removed by the wet etching using an alkaline aqueous solution. At this time, the nickel layer 20a (barrier metal layer) and the first interlayer insulating layer 30 (resin), which are formed under the connection pad P, function as an etching stop layer when the supporting plate 10 is etched.

Like the first embodiment, except the combination of copper and nickel, the barrier metal layer of the connection pad P may be formed of various metals, which are different from the supporting plate 10, so as to have the resistance when the supporting plate 10 is wet-etched.

Then, as depicted in FIG. 8D, the nickel layer 20a exposed from the lower surface of the connection pad P is removed by performing the wet etching selectively to the connection pad P (copper). As the etchant of the nickel layer 20a, nitric acid hydrogen peroxide mixture (a mixed solution of nitric acid and hydrogen peroxide ($HNO_3/H_2O_2$)) is used. By this matter, the concave level difference portion C is obtained in the first interlayer insulating layer 30 around the outer peripheral part of the connection pad P which is exposed.

With the above, a wiring substrate 2 according to the second embodiment is obtained. Here, in case the large-size supporting plate 10 available for the multi production is used, the wiring member in FIG. 8D is cut such that individual wiring substrates can be obtained.

In FIG. 9, the state that the wiring substrate 2 in FIG. 8D is reversed up and down is depicted. As depicted in FIG. 9, in the wiring substrate 2 of the second embodiment, the whole of the connection pad P is formed of the copper layer 20b. The connection pad P is formed of a lower layer part P1, and an upper layer part P2 whose diameter is set larger than a diameter of the lower layer part P1. A lower surface and a side surface of the lower layer part P1 of the connection pad P are buried in the first interlayer insulating layer 30.

Then, like the first embodiment, the concave level difference portion C is formed in the first interlayer insulating layer 30 around the outer periphery part of the upper layer part P2 of the connection pad P. The concave level difference portion C is formed from the upper surface of the first interlayer insulating layer 30 to the position corresponding to the lower surface of the upper layer part P2 of the connection pad P.

By this matter, an upper surface and a side surface of the upper layer part P2 of the connection pad P are exposed from the first interlayer insulating layer 30. The concave level difference portion C is provided to contact an outer peripheral edge of the upper layer part P2 of the connection pad P.

Then, like the first embodiment, the two-layer build-up wiring layer (the second and third wiring layers 22, 24, the first and second interlayer insulating layers 30, 32, and the protection insulating layer 34) connected to the connection pad P is formed to the lower surface side of the first interlayer insulating layer 30.

Then, like the wiring substrate 1 in FIG. 4 and FIG. 5 of the first embodiment, the semiconductor chip 40 is flip-chip connected to the connection pads P of the wiring substrate 2. Otherwise, like FIG. 6 of the first embodiment, the semiconductor chip 40 may be flip-chip connected to the connection parts of the third wiring layer 24, and then the external connection terminal 28 may be provided to the connection pads P.

Like a wiring substrate 2a depicted in FIG. 10, an antioxidant 23 (OSP (Organic Solder Passivation)) may be formed as a surface treatment layer on the copper layer 20b of the wiring substrate 2 in FIG. 9 to constitute the connection pad P.

The antioxidant is formed of an imidazole compound, or the like, and prevents the oxidation of the contact surface (copper) of the connection pad P. This antioxidant disappears when the solder bumps of the semiconductor chip are mounted onto the connection pads P by performing the reflow heating, or the like.

The wiring substrates 2, 2a of the second embodiment can achieve the similar advantages to those of the wiring substrate 1 of the first embodiment.

(Third Embodiment)

Figure 11A:
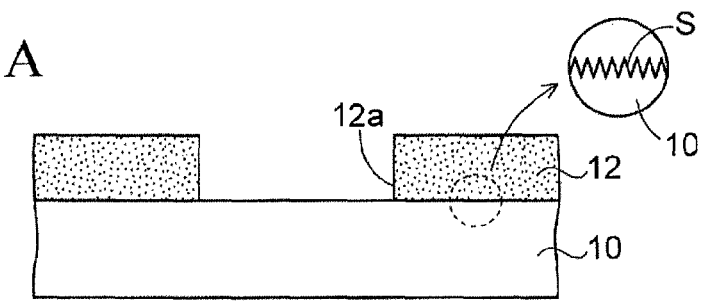
FIGS. 11A to 11D are sectional views (#1) depicting a method of manufacturing a wiring substrate according to a third embodiment.
Figure 11B:
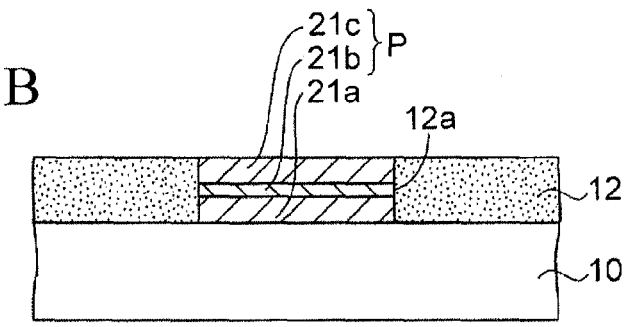
Figure 11C:
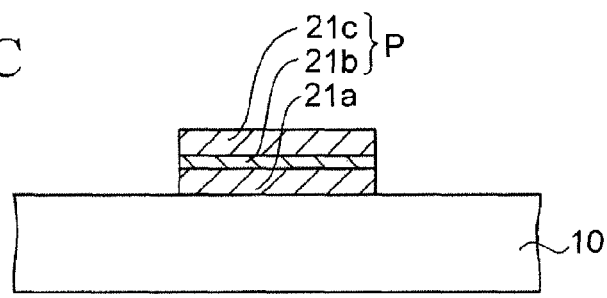
Figure 11D:
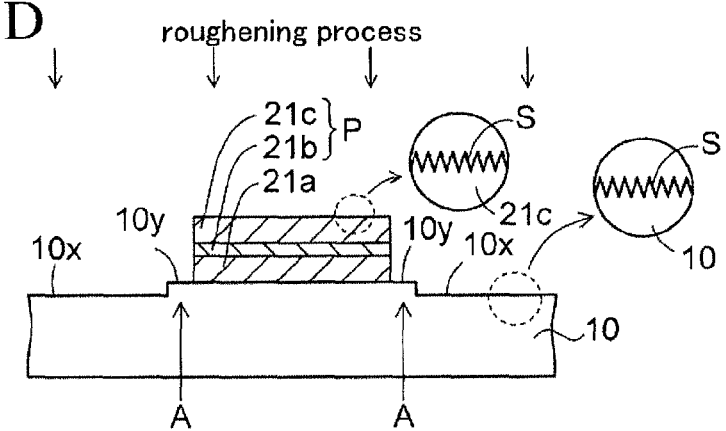
Figure 12A:
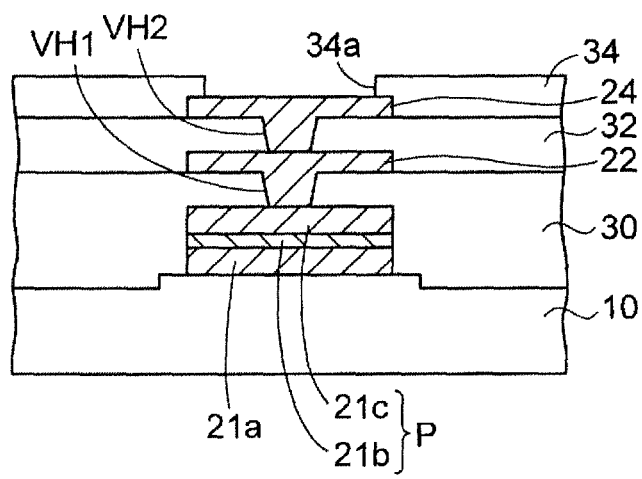
FIGS. 12A and 12B are sectional views (#2) depicting the method of manufacturing the wiring substrate according to the third embodiment.
Figure 12B:
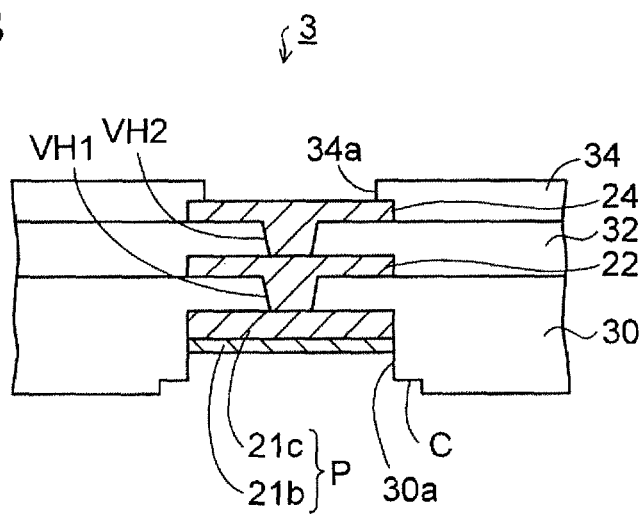
Figure 13:
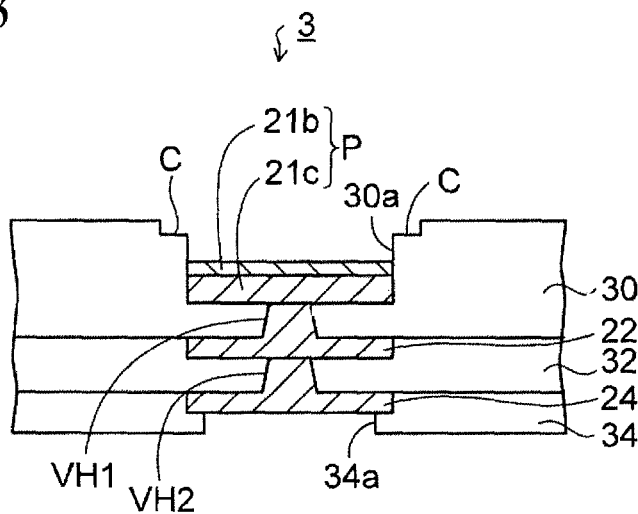
FIG. 13 is a sectional view depicting a wiring substrate according to the third embodiment.
Figure 14:
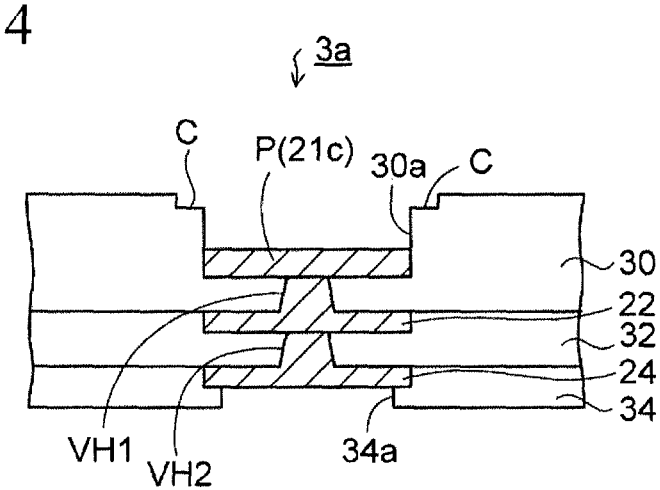
FIG. 14 is a sectional view depicting another wiring substrate according to the third embodiment.

FIGS. 11A to 11D and FIGS. 12A and 12B are sectional views depicting a method of manufacturing a wiring substrate according to a third embodiment, and FIG. 13 and FIG. 14 are sectional views depicting a wiring substrate according to the third embodiment. In this third embodiment, detailed explanation of the same steps and the same elements as those in the first embodiment will be omitted herein.

In the wiring substrate of the third embodiment, the connection pad is arranged to the bottom portion side of the concave portion on the first interlayer insulating layer, and then the concave level difference portion is provided in the first interlayer insulating layer around the upper outer periphery part of the concave portion.

In the method of manufacturing the wiring substrate according to the third embodiment, as depicted in FIG. 11A, like FIGS. 1A and 1B of the first embodiment, the dry film resist 12 in which the opening portion 12a is provided is patterned on the roughened surface S of the supporting plate 10 made of copper. In the third embodiment, the step of forming the concave portion in the supporting plate 10 is omitted herein.

Then, as depicted in FIG. 11B, a first copper layer 21a (sacrifice metal layer), a nickel layer 21b (barrier metal layer), and a second copper layer 21c are formed sequentially on the supporting plate 10 in the opening portion 12a of the dry film resist 12 by the electroplating utilizing the supporting plate 10 as a plating power feed path.

In the third embodiment, the connection pad P is formed of the nickel layer 21b (barrier metal layer) and the second copper layer 21c. The first copper layer 21a which is the undermost layer is formed as the sacrifice metal layer for obtaining a concave portion, and is removed finally. In this manner, a laminated metal layer is obtained by forming sequentially the sacrifice metal layer and the metal layer for the connection pad on the supporting plate 10 in the opening portion 12a of the dry film resist 12.

Then, as depicted in FIG. 11C, the dry film resist 12 is removed.

Then, as depicted in FIG. 11D, like the first embodiment, the roughening process liquid is sprayed onto a structural body in FIG. 11C by a spray equipment (not shown). Thereby, the surface of the connection pad P and the supporting plate 10 (copper) are etched, and thus the roughened surface S is obtained.

At this time, the ring-like part of the supporting plate 10 around the outer periphery part A of the connection pad P is formed as the convex level difference portion 10y whose height is higher than the other etched surface 10x.

Subsequently, as depicted in FIG. 12A, like FIG. 2C of the first embodiment, the two-layer build-up wiring layer (the second and third wiring layers 22, 24, the first and second interlayer insulating layers 30, 32, and the protection insulating layer 34) connected to the connection pad P is formed.

Then, as depicted in FIG. 12B, like FIG. 2D of the first embodiment, the supporting plate 10 (copper) is removed by performing the wet etching using an alkaline aqueous solution. At this time, the first copper layer 21a (sacrifice metal layer) formed under the connection pad P is etched sequentially and removed. By this matter, a concave portion 30a is provided in the first interlayer insulating layer 30 under the connection pad P, and also the concave level difference portion C is obtained in the outer periphery part of the concave portion 30a.

In the third embodiment, the supporting plate 10 and the sacrifice metal layer (first copper layer 21a) are formed of copper, and the barrier metal layer (nickel layer 21b) is formed as the lowermost layer of the connection pad P. Therefore, the supporting plate 10 and the sacrifice metal layer (first copper layer 21a) are removed selectively with respect to the connection pad P.

Like the first embodiment, except the combination of the copper and the nickel, the barrier metal layer of the connection pad P may be formed of various metals, which are different from the supporting plate 10 and the sacrifice metal layer, so as to have the resistance when the supporting plate 10 and the sacrifice metal layer are wet-etched.

With the above, a wiring substrate 3 of the third embodiment is obtained. Here, in case the large-size supporting plate 10 available for the multi production is used, a wiring member in FIG. 12B is cut such that individual wiring substrates can be obtained.

In FIG. 13, the state that the wiring substrate 3 in FIG. 12B is reversed up and down is depicted. In the wiring substrate 3 of the third embodiment, the connection pad P is formed of the second copper layer 21c and the nickel layer 21b (barrier metal layer) formed on the second copper layer 21c, and is formed to have the same diameter over the whole connection pad.

Like the first embodiment, the nickel layer 21b is illustrated as the barrier metal layer of the connection pad P. However, the barrier metal layer may be formed of either a single metal layer selected from a group consisting of gold (Au), palladium (Pd), nickel (Ni), copper (Cu), and silver (Ag) or a laminated metal film including two metals or more.

Like the first embodiment, preferably a laminated film formed of gold layer/nickel layer from the top, a laminated film formed of gold layer/palladium layer/nickel layer from the top, a laminated film formed of gold layer/silver layer/palladium layer/nickel layer from the top, a single layer film formed of a silver layer, a laminated film formed of silver layer/nickel layer from the top, a laminated film formed of silver layer/palladium layer/nickel layer from the top, or the like can be used in the state in FIG. 13.

In the above step in FIG. 11B, instead of the nickel layer 21b, any plating metal layer may be formed so as to obtain a desired barrier metal layer.

The concave portion 30a that the upper surface side is opened is formed in the first interlayer insulating layer 30, and the connection pad P is buried in the bottom side of the concave portion 30a. By this matter, the connection pad P is exposed form the first interlayer insulating layer 30 in a state that the upper surface of the connection pad P is arranged under the upper surface of the first interlayer insulating layer 30.

The concave level difference portion C whose height is lower than other upper surfaces of the first interlayer insulating layer 30 is formed like a ring shape in the first interlayer insulating layer 30 around the upper outer periphery part of the concave portion 30a.

In this way, in the third embodiment as well, the concave level difference portion C is formed in the first interlayer insulating layer 30 around the outer periphery part of the connection pad P.

Further, like the first embodiment, the two-layer build-up wiring layer (the second and third wiring layers 22, 24, the first and second interlayer insulating layers 30, 32, and the protection insulating layer 34) connected to the connection pad P is formed to the lower surface side of the first interlayer insulating layer 30.

Like a wiring substrate 3a depicted in FIG. 14, the connection pad P may be formed of the second copper layer 21c by removing the nickel layer 21b (barrier metal layer) from the connection pad P of the wiring substrate 3 in FIG. 13. In this mode, like FIG. 10 of the second embodiment, the antioxidant (OSP) may be formed on the exposed second copper layer 21c.

The wiring substrates 3, 3a of the third embodiment are manufactured as the coreless substrate which does not have a core substrate whose thickness is thick, and these wiring substrates can also be used as a mounting substrate on which a high-performance semiconductor chip is mounted.

Then, as depicted in FIG. 15, the flux (not shown) is coated on the connection pad P of the wiring substrate 3 in FIG. 13, and then the solder material 26 such as the solder paste, or the like is coated. Then, the solder bumps 42 of the semiconductor chip 40 are arranged on the solder materials 26 on the connection pads P of the wiring substrate 3.

Then, as depicted in FIG. 16, the semiconductor chip 40 is flip-chip connected to the connection pads P of the wiring substrate 3 by performing the reflow heating. An underfill resin may be filled in a clearance between the lower side of the semiconductor chip 40 and the upper surface of the wiring substrate 3.

Then, before or after the semiconductor chip 40 is mounted, the external connection terminal 28 is provided by mounting the solder ball on the connection parts of the third wiring layers 24, or the like.

In the wiring substrate 3 of the third embodiment, the connection pad P is arranged to the bottom side of the concave portion 30a of the first interlayer insulating layer 30, and also the concave level difference portion C is formed in the first interlayer insulating layer 30 around the outer periphery part of the concave portion 30a.

As a result, when the semiconductor chip 40 is flip-chip connected, the solder is dammed up with the concave portion 30a of the first interlayer insulating layer 30 and the concave level difference portion C. Therefore, it can be prevented that the extra solder flows to the adjacent connection pad P to cause an electric short-circuit.

Also, the concave portion 30a and the concave level difference portion C are formed in the first interlayer insulating layer 30 over and around the connection pads P. Therefore, the images of the fiducial marks can be clearly recognized. By this matter, the semiconductor chip can be aligned with the wiring substrate and be mounted with high precision.

Otherwise, like FIG. 6 of the first embodiment, the semiconductor chip 40 may be flip-chip connected to the connection portions of the wiring layer 24, and then the external connection terminals 28 may be provided on the connection pads P.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
an insulating layer;
a connection pad buried in the insulating layer in a state that an upper surface of the connection pad is exposed from an upper surface of the insulating layer and a lower surface and at least a part of a side surface of the connection pad contact the insulating layer; and
a concave level difference portion formed in the insulating layer around an outer periphery part of the connection pad,
wherein the upper surface of the connection pad and the upper surface of the insulating layer are arranged at a same height,
wherein the connection pad has two layers structure in which an upper layer part is formed on a lower layer part, and an outer peripheral edge of the lower layer part retrogresses toward a center of the connection pad from an outer peripheral edge of the upper layer part, and
wherein the upper layer part of the connection pad and the concave level difference portion have the same height, and a solder is formed on the connection pad and in a whole of the concave level difference portion.

2. A wiring substrate according to claim 1, wherein the upper layer part and the lower layer part of the connection pad are formed of a different metal layer.

3. A wiring substrate according to claim 1, wherein the upper layer part and the lower layer part of the connection pad are formed of the same metal layer.

4. A wiring substrate according to claim 1, wherein the upper layer part of the connection pad includes at least a metal layer selected from a group consisting of a gold layer, palladium layer, nickel layer, copper layer, or silver layer.

5. A wiring substrate according to claim 1, wherein,
the concave level difference portion is formed from the upper surface of the insulating layer to a position corresponding to a lower surface of the upper layer part of the connection pad.

6. A wiring substrate according to claim 1, wherein an n-layer (n is an integer of 1 or more) wiring layer connected to the connection pad is formed to a lower side of the insulating layer.

7. A wiring substrate, comprising:
an insulating layer;
a connection pad buried in the insulating layer in a state that an upper surface of the connection pad is exposed from an upper surface of the insulating layer and a lower surface and a whole of a part of a side surface of the connection pad contact the insulating layer; and
a concave level difference portion formed in the insulating layer around an outer periphery part of the connection pad,
wherein the connection pad is buried in a concave portion of the insulating layer, and the upper surface of the connection pad is arranged to a lower side than the upper surface of the insulating layer, and
wherein the lower surface of the connection pad is positioned to a bottom surface of the concave portion of the insulating layer, and
wherein the concave level difference portion is located in an upper outer periphery part of the concave portion, and the concave level difference portion is located at a position above an upper face of the connection pad.

8. A wiring substrate according to claim 7,
wherein the connection pad includes a lower layer part and an upper layer part formed on the lower layer part, and
wherein the upper layer part and the lower layer part of the connection pad are formed of a different metal layer.

9. A wiring substrate according to claim 8, wherein the upper layer part of the connection pad includes at least a metal layer selected from a group consisting of a gold layer, palladium layer, nickel layer, copper layer, or silver layer.

10. A wiring substrate according to claim 7, wherein an n-layer (n is an integer of 1 or more) wiring layer connected to the connection pad is formed to a lower side of the insulating layer.

11. A wiring substrate according to claim 7, wherein the connection pad is formed of a single metal layer.

12. A wiring substrate, comprising:
an insulating layer;
a connection pad buried in a concave portion provided in an upper surface of the insulating layer in a state that an upper surface of the connection pad is exposed from an upper surface of the insulating layer and a lower surface and at least a part of a side surface of the connection pad contact the insulating layer, wherein a lower surface of the connection pad is positioned to a bottom surface of the concave portion;

a via hole formed in the insulating layer under the connection pad, the via hole exposing the lower surface of the connection pad, wherein the via hole has a truncated cone shape in which a diameter of the via hole located to the connection pad side is smaller than a diameter of the via hole located to a lower surface side of the insulating layer;

a wiring layer formed on a lower surface of the insulating layer, and connected to the connection pad through a via formed in the via hole;

a concave level difference portion formed in the insulating layer around an outer periphery part of the connection pad, wherein the connection pad includes a lower layer part and an upper layer part, and an outer peripheral edge of the lower layer part retrogresses toward a center of the connection pad from an outer peripheral edge of the upper layer part, and wherein the upper layer part of the connection pad and the concave level difference portion have the same height, and a solder is formed on the connection pad and in a whole of the concave level difference portion.

13. A wiring substrate according to claim 12, wherein the upper layer part and the lower layer part of the connection pad are formed of a different metal layer.

14. A wiring substrate according to claim 12, wherein the upper layer part and the lower layer part of the connection pad are formed of the same metal layer.

15. A wiring substrate according to claim 12, wherein the upper layer part of the connection pad includes at least a metal layer selected from a group consisting of a gold layer, palladium layer, nickel layer, copper layer, or silver layer.

16. A wiring substrate according to claim 12, wherein a surface treatment layer is formed on the connection pad.

17. A wiring substrate according to claim 12, wherein the concave level difference portion is formed from the upper surface of the insulating layer to a position corresponding to a lower surface of the upper layer part of the connection pad.

18. A wiring substrate according to claim 12, wherein an n-layer (n is an integer of 1 or more) wiring layer connected to the connection pad is formed to a lower side of the insulating layer.

* * * * *